United States Patent
Fischer et al.

(10) Patent No.: US 6,986,088 B2
(45) Date of Patent: Jan. 10, 2006

(54) METHOD AND APPARATUS FOR REDUCING THE CURRENT CONSUMPTION OF AN ELECTRONIC CIRCUIT

(75) Inventors: Helmut Fischer, Oberhaching (DE); Johann Pfeiffer, Ottobrunn (DE); Rainer Florian Schnabel, Höhenkirchen (DE)

(73) Assignee: Infineon Technologies AG, Munich (DE)

( * ) Notice: Subject to any disclaimer, the term of this patent is extended or adjusted under 35 U.S.C. 154(b) by 410 days.

(21) Appl. No.: 10/245,622

(22) Filed: Sep. 17, 2002

(65) Prior Publication Data
US 2003/0102881 A1    Jun. 5, 2003

(30) Foreign Application Priority Data
Sep. 17, 2001    (DE) ............................... 101 45 727

(51) Int. Cl.
*G01R 31/28*    (2006.01)
(52) U.S. Cl. .................................................. 714/724
(58) Field of Classification Search ................ 714/718, 714/719, 724, 742, 743, 763; 324/763, 765; 365/200, 201
See application file for complete search history.

(56) References Cited

U.S. PATENT DOCUMENTS 5,248,937 A    9/1993  Höolzle .................... 324/158.1
6,216,248 B1 *  4/2001  Mc Connell et al. ....... 714/763

FOREIGN PATENT DOCUMENTS

DE    41 07 172 C2    9/1992
KR    00253283 B1     1/2000

OTHER PUBLICATIONS

Author not listed: "Double Data Rate (DDR) SDRAM Specification", JEDEC Solid State Technology Association, Jun. 2000, pp. 1-10.
Tietze, U. et al.: "Halblelter-Schaltungstechnik" [Semiconductor Circuitry], Springer Verlag, 1986, p. 215.

* cited by examiner

*Primary Examiner*—Albert Decady
*Assistant Examiner*—James C. Kerveros
(74) *Attorney, Agent, or Firm*—Laurence A. Greenberg; Werner H. Stemer; Ralph E. Locher

(57) ABSTRACT

The invention relates to a method for reducing the current consumption of an electronic circuit having at least one test module for testing the electronic circuit. The test module is connected to at least one line and/or a connection of the electronic circuit. A test control signal is generated, by means of which the test module is at least partially decoupled from the line or the connection in an operating mode of the electronic circuit such that switching currents are prevented in the test module.

16 Claims, 4 Drawing Sheets

METHOD AND APPARATUS FOR REDUCING THE CURRENT CONSUMPTION OF AN ELECTRONIC CIRCUIT

BACKGROUND OF THE INVENTION

Field of the Invention

The invention relates to a method and an apparatus for reducing the current consumption of an electronic circuit.

Nowadays, complex electronic circuits generally have test circuits. In fact, test circuits of this type are provided virtually on every integrated circuit. By way of example, dynamic random access memory devices (DRAMs) have test circuits for checking the functionality of the circuits, for example, logic and memory circuits, contained on the memory device. Test circuits of this type are activated in a special test mode of the electronic circuit and stimulate circuit nodes. The output signals obtained on account of the stimulation are then tested at further circuit nodes.

Dynamic memory devices are generally tested after specific fabrication steps. In this case, a test usually takes place after each integration stage of the dynamic memory device. By way of example, testing is effected after the production of a wafer with dynamic memory devices at the so-called wafer level, after incorporation into a housing, and after mounting on a memory module. In the context of these tests, not only are pure functional tests carried out, but also parameter windows such as, for example, temperature dependencies of the functions of the memory device are determined. In addition, defective circuit sections ascertained by these tests are replaced by redundant circuit elements. Finally, electrical parameters of the dynamic memory device can also be retuned by using fuses.

It is principally because of these extensive tests that very complex test circuits are necessary, which are generally no longer required in the later application of an electronic circuit in a terminal, for example, a personal computer or a mobile telephone. In order to lower the costs associated with the test circuits that are present on an integrated circuit, connections and lines that are utilized by the electronic circuit in normal operation (operating mode) are also utilized in the test operation or mode.

In many cases, by way of example, specific pads of an integrated circuit are used for test signals in the test mode. In the operating mode, by contrast, these pads are provided for other signals or even for the supplying voltage. In other words, the test circuits are generally connected to a few connections, in particular pads, and/or lines of the electronic circuit that are likewise utilized in the operating mode of the electronic circuit. As a result, the test circuits load the electronic circuit in normal operation, and in particular, they form a capacitive load. As a result, the power consumption of the electronic circuit is increased.

The capacitive load formed by the test circuits can be determined for example using the current consumption defined as IDD2N by JEDEC (Joint Electronic Devices Engineering Council). In order to measure this current consumption, a dynamic memory device is put into the so-called bank idle state—a quiescent state of the memory. Input signals having signal state changes are present at the command and address connections. By virtue of the fact that the address lines on the memory device are connected to a series of test circuits, a higher current IDD2N than without input signals and without a test circuit flows, despite the bank idle state, through at least partly activated test circuits.

In order to prevent the activation of the test circuits in the normal operating mode, modes of an electronic circuit have hitherto been coded by using specific mode register sets. As a result, at least some modules of test circuits should be deactivated in the normal operating mode. However, the coding requires encoders that are directly connected to the address bus of a memory device, for example. Therefore, test circuits are connected causing a measurable capacitive loading of the address bus, and a thus increased current IDD2N.

FIG. 3 illustrates by way of example a prior art test circuit 10 for an electronic circuit. The test circuit 10 is connected to a bus 18 of the electronic circuit. The connection between the test circuit 10 and the address bus 18 is effected via a sub-bus 16, since only a few address bits are required for decoding the modes of the electronic circuit.

A test mode encoder 12 of the test circuit 10 is connected to the sub-bus 16 and continuously decodes the mode of the electronic circuit using the test control signals transmitted via the bus 18. In the decoded mode, the test mode encoder 12 forwards a so-called test mode supervisory signal 14 to further modules (not illustrated) of the test circuit 10. Depending on the test mode supervisory signal 14, it is possible to activate modules for testing the electronic circuit. In the normal operating state of the electronic circuit, however, the current consumption is increased by the test mode encoder 12.

The construction of a test circuit 10 is illustrated in somewhat greater detail in FIG. 4. An inverter 22 of a function block 20 of the test circuit 10 is connected to a sub-bus 16. A further inverter 24 and an inverter 28 that can be turned off are connected downstream of the inverter 22. The inverter 28 that can be turned off can be turned off by using a test mode supervisory signal 14 (see FIG. 3). As a result, further test circuit function blocks 26 are electrically decoupled from the address bus 18. The sub-bus 16 and thus the address bus 18 are loaded by the input capacitance of the first inverter 22. Since the first inverter 22 must be dimensioned appropriately for driving the further gates connected downstream of it, the input capacitance of the first inverter 22 is generally very large. A relatively large current flows into the first inverter 22 in the normal operating state of the electronic circuit. Despite the decoupling of important test circuit function blocks 26 from the address bus 18, however, the current consumption is still high compared with, for example, an electronic circuit that does not have test circuits of this type.

SUMMARY OF THE INVENTION

It is accordingly an object of the invention to provide an apparatus and a method for reducing the current consumption of an electronic circuit, which overcome the above-mentioned disadvantages of the prior art apparatus and methods of this general type.

In particular, it is an object of the invention to provide a method and an apparatus for further reducing the current consumption of an electronic circuit as compared with the solutions outlined in the introduction.

With the foregoing and other objects in view there is provided, in accordance with the invention, a method for reducing a current consumption of an electronic circuit having at least a first test module and a second test module for testing the electronic circuit. The first test module and the second module each have at least one decoder and at least one test function block. The method includes steps of: using the decoder of the first test module to connect the first test module to a first element selected from a group consisting of at least one line of the electronic circuit and a connection of the electronic circuit; using the decoder of the second test module to connect the second test module to a second element selected from a group consisting of at least one line of the electronic circuit and a connection of the electronic circuit; and generating a global test control signal that is used to at least partially decouple the first test module from the first element of the electronic circuit and that is used to at least partially decouple the second test module from the second element of the electronic circuit such that, in an operating mode of the electronic circuit, switching currents are prevented in the first test module and in the second test module.

In accordance with an added mode of the invention, the method includes: activating the global test control signal in a test mode of the electronic circuit; and deactivating the global test control signal in the operating mode of the electronic circuit.

In accordance with an additional mode of the invention, the method includes: using a decoder to decode fed-in mode signals in order to determine a test mode; and generating the global test control signal from the mode signals.

In accordance with another mode of the invention, the method includes: generating the global test control signal by a predetermined combination of the mode signals.

In accordance with a further mode of the invention, the method includes: using a bit combination that is excluded by a JEDEC specification as the predetermined combination; and obtaining the predetermined combination from a bit combination selected from a group consisting of "11" made up of bits 7 and 8 of a mode setting address, and "10" made up of the bits 7 and 8 of the mode setting address.

In accordance with a further added mode of the invention, the method includes: providing a flip-flop having an output signal forming the global test control signal; and using a control pulse to store the predetermined combination in the flip-flop.

In accordance with another added mode of the invention, the method includes: configuring the test function block of the first test module to test the electronic circuit in a test mode; and in the operating mode, decoupling the test function block of the first test module from the first element.

In accordance with yet an added mode of the invention, the method includes configuring the test function block of the first test module to generate stimulation signals for the electronic circuit.

With the foregoing and other objects in view there is provided, in accordance with the invention, an apparatus for reducing a current consumption of an electronic circuit. The apparatus includes: at least a first test module and a second test module for testing the electronic circuit. The first test module and the second test module each have at least one decoder and at least one test function block. The decoder of the first test module connects the first test module to at least one line of the electronic circuit or a connection of the electronic circuit. The decoder of the second test module connects the second test module to at least one line of the electronic circuit or a connection of the electronic circuit.

The apparatus also includes: a first device for decoupling the first test module from the first element and for decoupling the second test module from the second element; and a second device for generating at least one test control signal driving the first device.

In accordance with an added feature of the invention, the first device includes gates that can be turned off.

In accordance with an additional feature of the invention, the gates are inverters and/or transmission gates.

In accordance with another feature of the invention, the first device is connected between the function block of the first test module and the first element.

In accordance with a further feature of the invention, the first device is connected between the function block of the second test module and the second element.

In accordance with a further added feature of the invention, the second device includes a decoder designed to generate the test control signal using fed-in address test control signals.

An essential point of the invention is the generation of a test control signal that serves for coupling circuit sections provided for testing to lines and/or connections of an electronic circuit. As a result of this, in a "normal" operating mode of the electronic circuit (with the test control signal deactivated), the current consumption can be reduced such that it is lower than in the case of the methods and circuit techniques that are disclosed in the prior art and outlined in the introduction. The test control signal may serve for globally coupling all of the circuit sections provided for testing on an integrated circuit. These circuit sections may be, for example, decoders or entire function blocks of test circuits. With the test control signal deactivated, i.e. in the normal operating state, these circuit sections are decoupled from lines and/or connections of the electronic circuit. The decoupling significantly reduces the capacitive load of the circuit sections provided for testing for the electronic circuit, in particular, on the abovementioned lines and/or connections. Primarily, switching currents are reduced in the circuits that are provided for testing (test circuits, test modules). On one hand, only a very small current flows, despite a test module, for example, on account of the reduction of the capacitive load in the normal operating state. On the other hand, the test module is inactive in the decoupled state—that is to say in the normal operating state, so that switching currents are significantly reduced in the test module.

The test control signal is activated in a test mode of the electronic circuit. In other words, with the test control signal activated, circuit sections provided for testing are coupled to lines and/or connections of the electronic circuit. As a result of this, the test module for testing the electronic circuit, is connected to at least some lines and/or connections of the electronic circuit. By contrast, these circuit sections are decoupled when the test control signal is deactivated. The test control signal is thus deactivated in order to at least partially decouple the test module in the operating mode of the electronic circuit.

The test control signal can be generated by a decoder that determines a test mode from fed-in mode signals and that generates the test control signal by decoding the mode signals. This decoder need only be provided once and can be designed using a current-saving circuit technology. This "centralization" of the generation of the test control signal makes it possible to obviate circuit sections, as a result of which, the current consumption in turn decreases.

Preferably, the test control signal is generated from a predetermined combination of the mode signals. Different modes of the electronic circuit are set by the mode signals. These modes may be, for example, different test and operating modes.

In a particularly preferred embodiment, the predetermined combination is a bit combination "11" or "10" of bits 7 and 8 of a mode setting address. This bit combination is excluded by the JEDEC specification. Different bit combinations of the mode setting address are already allocated in the JEDEC specification. However, this does not apply to the bit combinations "11" and "10" of bits 7 and 8. Therefore, these bit combinations that are not yet allocated by the JEDEC specification can ideally be used for generating the test control signal.

In a currently preferred embodiment of the method, the predetermined combination is stored in a flip-flop using a control pulse. The output signal of the flip-flop is the test control signal. The combination determined generally remains stored in the flip-flop until a test mode is ended explicitly, i.e. in particular by a signal provided therefore.

In the case of most electronic circuits, it is only necessary to decouple individual parts of a test module of the electronic circuit, since only these are connected to at least one line and/or a connection of the electronic circuit. Therefore, in a preferred embodiment, at least one test function block of the at least one test module is decoupled from the at least one line or the at least one connection in the operating mode. In the test mode, the test function block serves essentially for testing the electronic circuit. In particular, it generates stimulation signals for the electronic circuit.

The invention furthermore relates to an apparatus for reducing the current consumption of an electronic circuit having at least one test module, which is provided for testing the electronic circuit and is connected to at least to a line and/or a connection of the electronic circuit. A first device is provided for decoupling at least one function block of the at least one test module from the at least one line and/or the at least one connection. The first device is driven by at least one test control signal generated by a second device.

Preferably, the first device includes gates that can be turned off, in particular inverters or transmission gates. Such elements are of simple construction and take up little silicon area, for example, in the case of an integrated circuit. They are therefore preferably suitable for use as decoupling elements.

In a preferred embodiment, the first device is connected between at least one function block of the test module and the at least one line and/or the at least one connection. The first device isolates, as it were, a function block of the test module from the elements of the electronic circuit.

Isolation is understood here to mean, in particular, decoupling. What is essential is that, as a result of the decoupling, the capacitive load for the electronic circuit is reduced and switching currents of downstream gates are prevented in the turned-off state. Therefore, the first device should preferably isolate parts of the test module from the at least one line and/or the at least one connection which generate the largest capacitive load there.

The second device may include a decoder that is designed to generate the test control signal using fed-in address signals. The decoder filters a specific bit combination from the fed-in address signals. The bit combination corresponds to a test mode. To be concise, it serves for detecting a test mode and for generating a test control signal.

Preferably, the apparatus is implemented on an integrated circuit, in particular a dynamic memory device.

Other features which are considered as characteristic for the invention are set forth in the appended claims.

Although the invention is illustrated and described herein as embodied in a method and apparatus for reducing the current consumption of an electronic circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

In the following description, identical reference symbols have been used throughout the figures for identical or functionally equivalent elements.

Figure 1A:
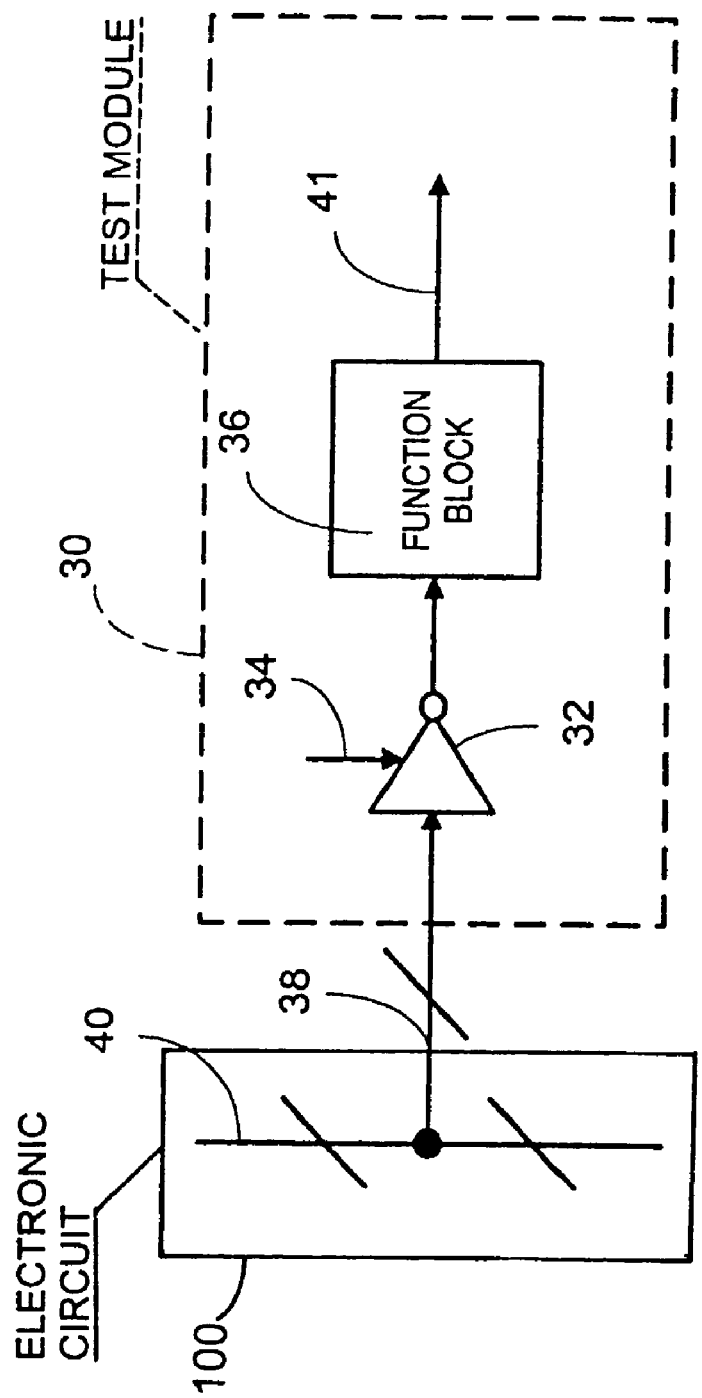
FIG. 1A shows an exemplary embodiment of an apparatus for reducing the current consumption of an electronic circuit.

Referring now to FIG. 1A in detail, there is shown a test module 30 that is connected via a sub-bus 38 to a bus 40 of an electronic circuit 100. The test module 30 serves for generating test signals for the electronic circuit 100. The test module 30 is typically a logic circuit designed for generating test patterns. These test patterns can in turn be used to test logic elements of a dynamic memory device, in particular a 256 Mbit DRAM.

The sub-bus 38 is fed to an inverter 32, which can be turned off by a test control signal 34. More precisely, the inverter, illustrated as individual inverter 32, is a multiplicity of inverters in accordance with the multiplicity of test control signal lines of the sub-bus 38. A respective inverter 32 that can be turned off and to which the test control signal 34 is passed is provided for each signal line in the sub-bus 38. The output of the inverter 32 that can be turned off is connected to a function block 36 of the test module 30, which serves for generating a test module supervisory signal 41. The test module supervisory signal 41 drives further function blocks (not illustrated) of the test module 30 and circuit elements of the dynamic memory device.

The function block 36 can be decoupled from the sub-bus 38 and thus from the bus 40 by the inverter 32 that can be turned off. As a result, the sub-bus 38 is only loaded by the input capacitance of the inverter 32 that can be turned off. This is a very much smaller capacitance than the total input capacitance of the more complex function block 36. Furthermore, no switching currents occur in the function block 36. As a result, both in a test mode and in a normal operating mode of the memory device, a smaller current flows from the sub-bus 38 into the inverter 32 and into the function block 36 than would be the case without the inverter 32 that can be turned off. By using such inverters 32 that can be turned off, in a dynamic memory device, all of the test modules are chip-globally decoupled from circuit elements that are also utilized in the normal operating mode of the dynamic memory device. This decoupling reduces the capacitive load in the normal operating mode, under the supervision of the test control signal caused by the circuit sections provided for test functions.

The test control signal 34 is present globally on the dynamic memory device. It is passed to each inverter 32 that can be turned off which is present on the dynamic memory device and is utilized for decoupling function blocks of test modules from circuit elements in the normal operating state of the memory device.

Figure 1B:
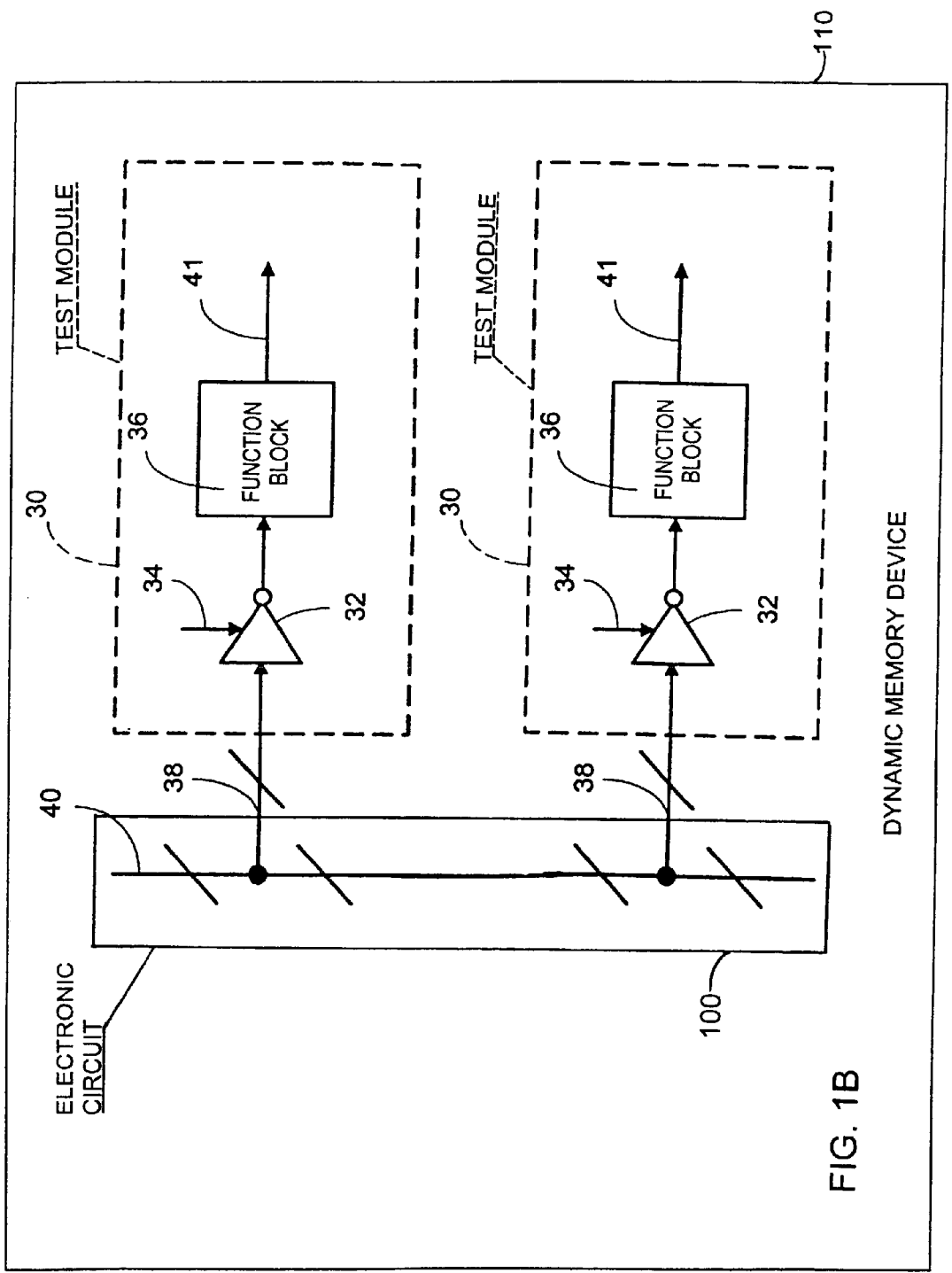
FIG. 1B shows two test modules implemented on a DRAM.

FIG. 1B shows two test modules 30 that are implemented on a dynamic memory device 110. Each inverter 32 receives the test control signal 34 for decoupling the respective functional block 38 from the bus 40 of the electronic circuit 100. The inverters 32 can be thought of as a first device.

Figure 2:
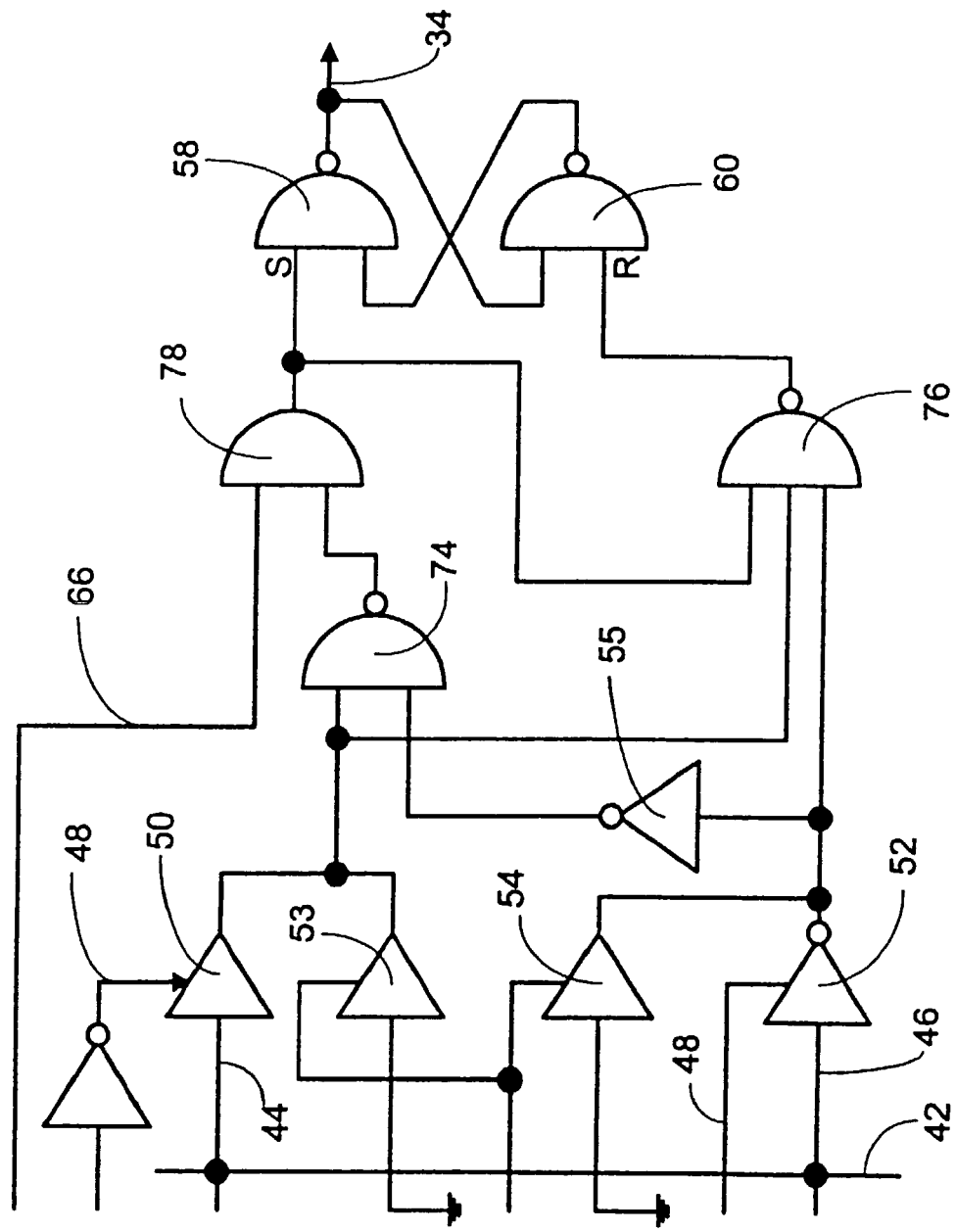
FIG. 2 shows a first exemplary embodiment of a device for generating a test control signal for decoupling a test module from a line of an electronic circuit.
Figure 3:
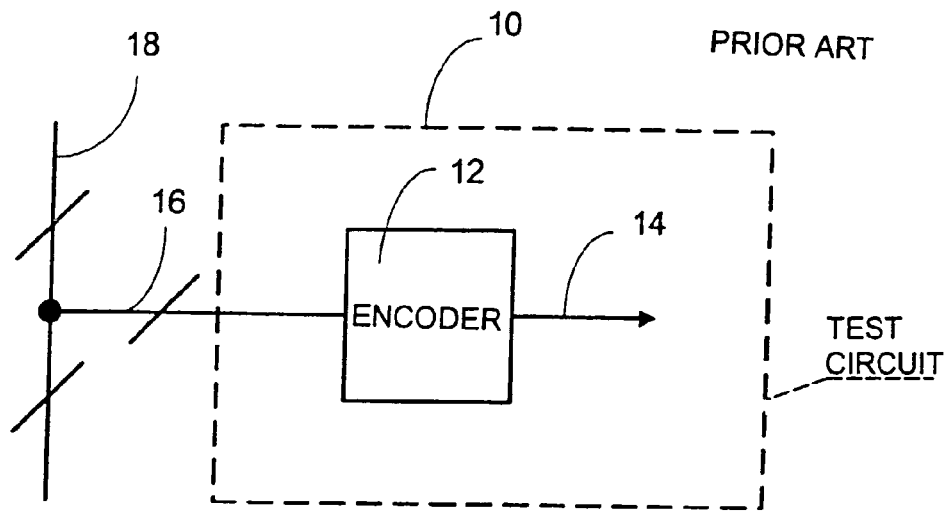
FIG. 3 shows a prior art test circuit connected to a bus of an electronic circuit.
Figure 4:
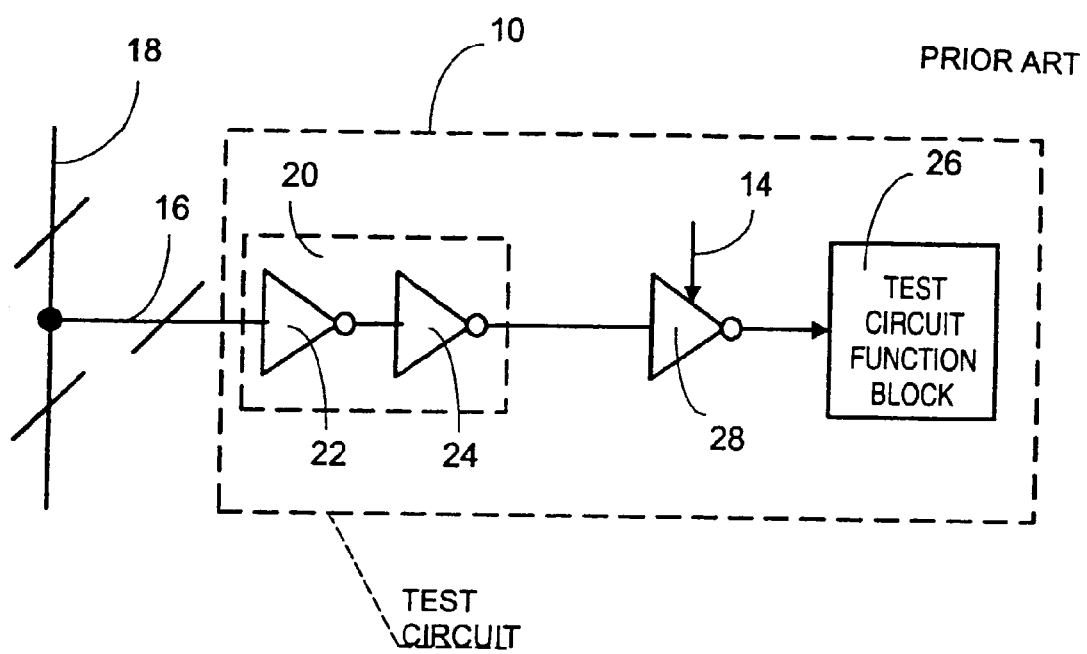
FIG. 4 shows a prior art test circuit in which a function block of the test circuit can be electrically decoupled from a bus of an electronic circuit.

FIG. 2 illustrates a circuit (a second device) for generating the test control signal 34. The test control signal 34 is essentially derived from two address bits from an address bus 42 of the memory device. The address bits are an address bit SA[7], identified by reference numeral 44, and an address bit SA[8], identified by reference numeral 46. The circuit decodes the test control signal 34 from the bit combination "10" of the two address bits SA[7] and SA[8].

These two address bits 44 and 46 are respectively fed to a transmission gate 50 and a tristate inverter 52. The transmission gate 50 and the tristate inverter 52 are driven by a so-called MRS (mode register set) pulse 48. If the MRS pulse becomes active, the transmission gate 50 and the tristate inverter 52 are enabled. As a result, the address bit 44 and the inverted signal 46 are switched through to two of the three inputs of a NAND gate 76. The inverted signal 46 is again inverted by a second inversion stage 55 and switched through together with the signal 44 to the input of the NAND gate 74. The output signal of the NAND gate 74 is coupled to a signal 66 from the POWER-UP sequence, e.g. CHIPRDY, by an AND gate 78. This signal is initially 0, and after running through the POWER-UP sequence, is a logic 1. This serves to initialize the output signal GTME 34 to a logic 0. Through the combination of the signal resulting from the AND gate 78 with one of the three inputs of the NAND gate 76, for example, during initialization, the signal S is set to ground if R=1. The signals R and S resulting from the NAND gates 76 and 78 are led to a set-reset flip-flop formed by the mutually oppositely connected NAND gates 58 and 60.

If no MRS pulse is present, the transmission gate 50 and the tristate inverter 52 are closed. Instead, the transmission gates 53 and 54 are opened, whose inputs are at low level in the steady state. This has the effect that the signals S and R become logic 1. The output 34 then remains in its previously defined state.

The NAND gates 74 and 76 serve as a decoder in order to generate the signals S and R from bit combinations of SA[7,8] in accordance with the table below. If the signal S is logic 0, the test control signal GTME 34 is activated (logic 1). By contrast, if the signal R becomes logic 0, GTME 34 is reset to logic 0. If S and R are both set to logic 1, the previous state of GTME is maintained. This results in the below-specified programming table showing GTME as a function of SA[7,8]. The test control signal 34 is activated by SA[7,8]=[1,0] (logic 1) and is reset by SA[7,8]=[1,1] (logic 0).

Since the address combinations SA[7,8]=[1,1] are excluded for normal operation by JEDEC, they are ideally suitable for the activation and deactivation of the test control signal.

| SA[7] | SA[8] | S | R | GTME 34 |
|---|---|---|---|---|
| 1 | 0 | 0 | 1 | 1 |
| 1 | 1 | 1 | 0 | 0 |
| 0 | 1 | 1 | 1 | as before |
| 0 | 0 | 1 | 1 | as before |

The activated test control signal 34 activates all of the inverters or transmission gates or tristate inverters that can be turned off and are contained in a dynamic memory device and are controlled by the test control signal 34. As a result of this, all of the function blocks of test modules on the dynamic memory device are connected to lines and/or connections on the dynamic memory device. The memory device can now be tested.

The activation and deactivation of the test control signal 34, which is also designated as global test mode enable (GTME) signal on a memory device, is illustrated using the table below:

| | START | POWER is present | MRS with TMENABLE code | After MRS pulse | TMEXIT |
|---|---|---|---|---|---|
| PWRUP | 0 | 1 | 1 | 1 | 1 |
| Set | 1 | 1 | 0 | 1 | 1 |
| Reset | 0 | 1 | 1 | 1 | 0 |
| TMEXIT | 0 | 0 | 0 | 0 | 1 |
| GTME | 0 | 0 | 1 | 1 | 0 |

In a typical operating case, the test control signal 34, which is initially logic "0", is activated after the end of a power-up sequence on a dynamic memory device by an MRS pulse 48 and the corresponding code for the test mode, which is formed by the bit combination "10" of the two address bits 44 and 46. After the end of the MRS pulse 48, the test control signal 34 first remains stably activated. It is reset or deactivated again only by a mode register setting with SA[7,8]=[1,1].

The deactivation of the test control signal can be used for the following purposes:
1. The setting of new test modes is prevented; and
2. Before the activation of the test control signal, the chip can be set into a test state that is also maintained after the deactivation of the test control signal. This allows a realistic current measurement (e.g. IDD2N) with decoupled test circuits under conditions that would not be reached without test modes (e.g. modified internal voltage values).

We claim:

1. A method for reducing a current consumption of an electronic circuit having at least a first test module and a second test module for testing the electronic circuit, the first test module and the second module each having at least one decoder and at least one test function block, the method which comprises:
    using the decoder of the first test module to connect the first test module to a first element selected from a group consisting of at least one line of the electronic circuit and a connection of the electronic circuit;
    using the decoder of the second test module to connect the second test module to a second element selected from a group consisting of at least one line of the electronic circuit and a connection of the electronic circuit; and generating a global test control signal that is used to at least partially decouple the first test module from the first element of the electronic circuit and that is used to at least partially decouple the second test module from the second element of the electronic circuit such that, in an operating mode of the electronic circuit, switching currents are prevented in the first test module and in the second test module.

2. The method according to claim 1, which comprises:
activating the global test control signal in a test mode of the electronic circuit; and
deactivating the global test control signal in the operating mode of the electronic circuit.

3. The method according to claim 1, which comprises:
using a decoder to decode fed-in mode signals in order to determine a test mode; and
generating the global test control signal from the mode signals.

4. The method according to claim 3, which comprises:
generating the global test control signal by a predetermined combination of the mode signals.

5. The method according to claim 4, which comprises:
using a bit combination that is excluded by a JEDEC specification as the predetermined combination; and
obtaining the predetermined combination from a bit combination selected from a group consisting of "11" made up of bits 7 and 8 of a mode setting address, and "10" made up of the bits 7 and 8 of the mode setting address.

6. The method according to claim 5, which comprises:
providing a flip-flop having an output signal forming the global test control signal; and
using a control pulse to store the predetermined combination in the flip-flop.

7. The method according to claim 1, which comprises:
configuring the test function block of the first test module to test the electronic circuit in a test mode; and
in the operating mode, decoupling the test function block of the first test module from the first element.

8. The method according to claim 7, which comprises:
configuring the test function block of the first test module to generate stimulation signals for the electronic circuit.

9. An apparatus for reducing a current consumption of an electronic circuit, the apparatus comprising:
at least a first test module and a second test module, said first test module and said second test module being for testing the electronic circuit, said first test module and said second test module each having at least one decoder and at least one test function block, said decoder of said first test module connecting said first test module to a first element selected from a group consisting of at least one line of the electronic circuit and a connection of the electronic circuit, said decoder of said second test module connecting said second test module to a second element selected from a group consisting of at least one line of the electronic circuit and a connection of the electronic circuit;
a first device for decoupling said first test module from said first element and for decoupling said second test module from said second element; and
a second device for generating at least one test control signal driving said first device.

10. The apparatus according to claim 9, wherein said first device includes gates that can be turned off.

11. The apparatus according to claim 10, wherein said gates are selected from a group consisting of inverters and transmission gates.

12. The apparatus according to claim 9, wherein:
said first device is connected between said function block of said first test module and said first element.

13. The apparatus according to claim 12, wherein:
said first device is connected between said function block of said second test module and said second element.

14. The apparatus according to claim 9, wherein: said second device includes a decoder designed to generate the test control signal using fed-in address test control signals.

15. The apparatus according to claim 9, wherein said first test module, said second test module, said first device, and said second device are implemented on an integrated circuit.

16. The apparatus according to claim 9, wherein said first test module, said second test module, said first device, and said second device are implemented on a dynamic memory device.

* * * * *